(12) United States Patent
Kase et al.

(10) Patent No.: US 7,432,754 B2
(45) Date of Patent: Oct. 7, 2008

(54) VOLTAGE CONTROL CIRCUIT HAVING A POWER SWITCH

(75) Inventors: Kiyoshi Kase, Austin, TX (US); Dzung T. Tran, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 41 days.

(21) Appl. No.: 11/460,349

(22) Filed: Jul. 27, 2006

(65) Prior Publication Data

US 2008/0024192 A1 Jan. 31, 2008

(51) Int. Cl.
*H03K 17/00* (2006.01)

(52) U.S. Cl. ............... 327/408; 327/108; 327/407; 327/534

(58) Field of Classification Search ......... 327/407–410, 327/534, 108–112
See application file for complete search history.

(56) References Cited

U.S. PATENT DOCUMENTS

| | | | |
|---|---|---|---|
| 5,966,043 A * | 10/1999 | Jinbo | 327/530 |
| 6,313,672 B1 * | 11/2001 | Ajit et al. | 327/112 |
| 6,339,357 B1 * | 1/2002 | Yamasaki et al. | 327/538 |
| 6,377,106 B1 | 4/2002 | Rozsypal | |
| 6,476,664 B2 * | 11/2002 | Rolandi et al. | 327/534 |
| 6,674,304 B1 * | 1/2004 | Matthews | 326/80 |
| 7,202,729 B2 * | 4/2007 | Bhagavatheeswaran et al. | 327/534 |
| 2007/0205668 A1 * | 9/2007 | Chen | 307/64 |

* cited by examiner

*Primary Examiner*—Lincoln Donovan
*Assistant Examiner*—Patrick O'Neill
(74) *Attorney, Agent, or Firm*—Zagorin O'Brien Graham LLP

(57) ABSTRACT

A voltage control circuit includes a first transistor coupled to a first voltage supply terminal having a first voltage, a second transistor coupled to the first transistor and a node, a third transistor coupled to a second voltage supply terminal and the node, wherein the second voltage supply terminal has a second voltage and the node is at a voltage selected from the group consisting of the first voltage and the second voltage, and a fourth transistor coupled to the node.

14 Claims, 2 Drawing Sheets

VOLTAGE CONTROL CIRCUIT HAVING A POWER SWITCH

BACKGROUND OF THE INVENTION

1. Field of the Invention

This invention relates in general to circuits and more specifically to a voltage control circuit having a power switch.

2. Description of the Related Art

In certain applications a node of an integrated circuit may need different voltage supply depending upon the mode of operation. Traditional circuits for coupling different supply voltages to the node of the integrated circuit suffer from problems, such as leakage current. The presence of leakage current in turn increases the power consumption by the integrated circuit.

Thus, there is a need for a voltage control circuit having a power switch.

BRIEF DESCRIPTION OF THE DRAWINGS

The present invention may be better understood, and its numerous objects, features, and advantages made apparent to those skilled in the art by referencing the accompanying drawings.

Figure 1:
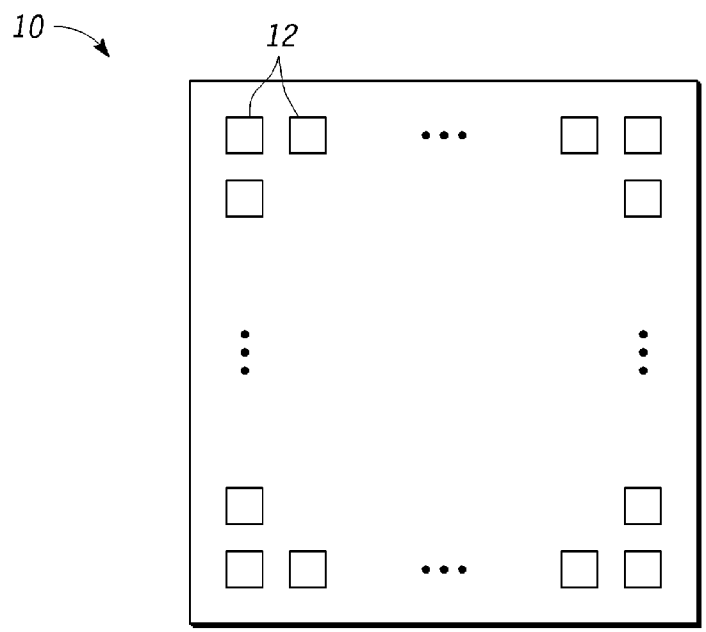
FIG. 1 shows a diagram of an exemplary integrated circuit, consistent with one embodiment of the invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

The following sets forth a detailed description of a mode for carrying out the invention. The description is intended to be illustrative of the invention and should not be taken to be limiting.

In one aspect, a voltage control circuit is provided. The voltage control circuit may include a first transistor coupled to a first voltage supply terminal having a first voltage, a second transistor coupled to the first transistor and a node, a third transistor coupled to a second voltage supply terminal and the node, wherein the second voltage supply terminal has a second voltage and the node is at a voltage selected from the group consisting of the first voltage and the second voltage, and a fourth transistor coupled to the node.

In another aspect, a voltage control circuit is provided. The voltage control circuit may include a first transistor and a second transistor coupled in series, wherein the second transistor has a first conducting terminal and a second conducting terminal and the first conducting terminal is coupled to the first transistor. The voltage control circuit may further include a third transistor and a fourth transistor coupled in series, wherein the third transistor has a first bulk region, the fourth transistor has a second bulk region and the first bulk region, the second bulk region, and the second conducting terminal of the second transistor are coupled to a node.

In yet another aspect, a voltage control circuit is provided. The voltage control circuit may include a first driver coupled to a first voltage supply terminal, a power switch coupled to the first voltage supply terminal, a second voltage supply terminal, and an enable terminal. The power switch may include a first transistor having a first conducting terminal, a second conducting terminal, and a first bulk region, wherein the first conducting terminal is coupled to the first voltage supply terminal and the first conducting terminal is coupled to the first bulk region. The power switch may further include a second transistor having a third conducting terminal, a fourth conducting terminal and a second bulk region, wherein the third conducting terminal is coupled to the second conducting terminal of the first transistor, the fourth conducting terminal is coupled to the second bulk region and the fourth conducting terminal is coupled to a node. The power switch may further include a third transistor having a fifth conducting terminal, a sixth conducting terminal and a third bulk region, wherein the fifth conducting terminal is coupled to the second voltage supply terminal, the sixth conducting terminal is coupled to the third bulk region and the sixth conducting terminal is coupled to the node. The power switch may further include a fourth transistor having a seventh conducting terminal, an eighth conducting terminal and a fourth bulk region, wherein the seventh conducting terminal is coupled to the node and the seventh conducting terminal is coupled to the fourth bulk region. The voltage circuit may further include a second driver coupled to the enable terminal and the eighth conducting terminal of the fourth transistor of the power switch.

FIG. 1 shows a diagram of an exemplary integrated circuit 10, consistent with one embodiment of the invention. Although not shown, integrated circuit 10 may include components, such as a processor, memory, or any other devices. Integrated circuit 10 may have one or more nodes, which may need to be coupled to at least one driver. Each driver, in turn, may be coupled to a voltage supply terminal or rail (not shown). For example, FIG. 1 shows internal nodes 12 (e.g., bonding pads) as part of integrated circuit 10.

Figure 2:
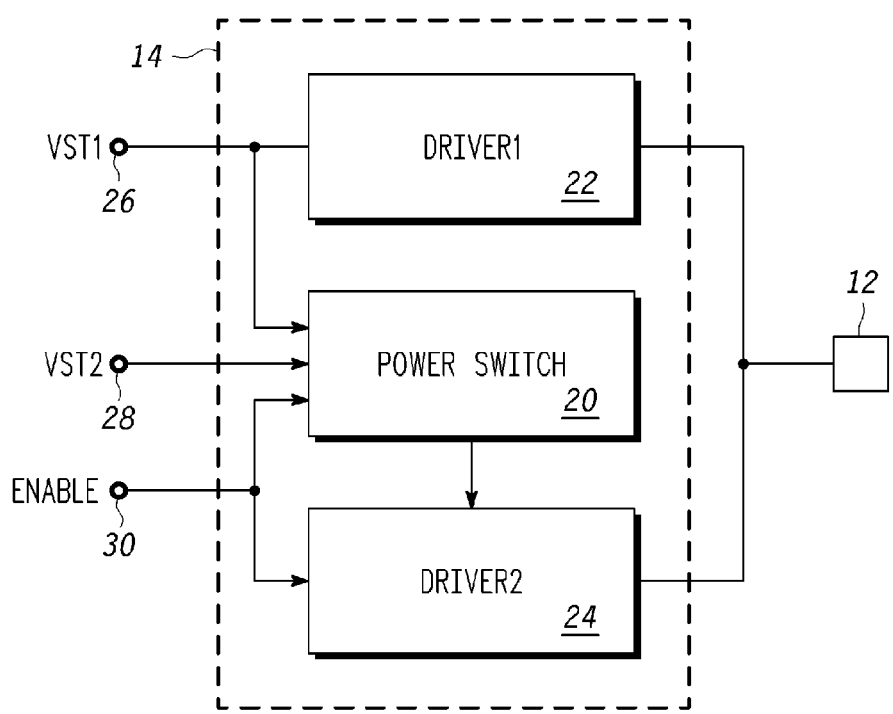
FIG. 2 shows a block diagram of an exemplary implementation of a voltage control circuit, consistent with one embodiment of the invention.

FIG. 2 shows a block diagram of an exemplary implementation of a voltage control circuit 14, consistent with one embodiment of the invention. Voltage control circuit 14 may receive at least three inputs and provide an output voltage supply that may be coupled to an external node 12, for example. By way of example, voltage control circuit 14 may include a power switch 20, a first driver 22 (labeled as DRIVER 1), and a second driver 24 (labeled as DRIVER 2). First driver 22 and second driver 24 may be implemented using conventional techniques. In addition, by way of example, first driver 22 may receive a first voltage via a first voltage supply terminal 26 (labeled as VST1). Second driver 24 may receive (by way of power switch 20) a second voltage via a second voltage supply terminal 28 (labeled as VST2). Power switch 20 may receive the first voltage via first voltage supply terminal 26. Power switch 20 may also receive the second voltage via second voltage supply terminal 28. By way of example, first voltage may correspond to a voltage between 1.8 volts to 3.3 volts and second voltage may correspond to 1.2 volts. Further, by way of example, first driver 22 may correspond to a general purpose input output GPIO driver and second driver 24 may correspond to a mobile industry processor interface (MIPI) driver. Further, power switch 20 may receive an enable signal via an enable terminal 30 (labeled as ENABLE) and second driver 24 may also receive enable signal 30. In one embodiment, the enable signal may be generated by a source of the first voltage supply and the second voltage supply. By way of example, the enable signal may be generated by another integrated circuit or device.

In operation, power switch 20 may couple either the first voltage (coupled via first voltage terminal 26) or the second voltage (coupled via second voltage terminal 28) to internal node 12 based on the state of a signal coupled to enable terminal 30. The signal coupled to enable terminal 30 may also be used to enable or disable power switch 20 and/or second driver 24. By way of example, the enable signal may be sent by another integrated circuit that supplies the first voltage and the second voltage to voltage control circuit 14. That integrated circuit may turn-off the first voltage or the second voltage in combination with an appropriate value of the enable signal. By way of example, an unused voltage supply may always be turned off, thus saving power.

Figure 3:
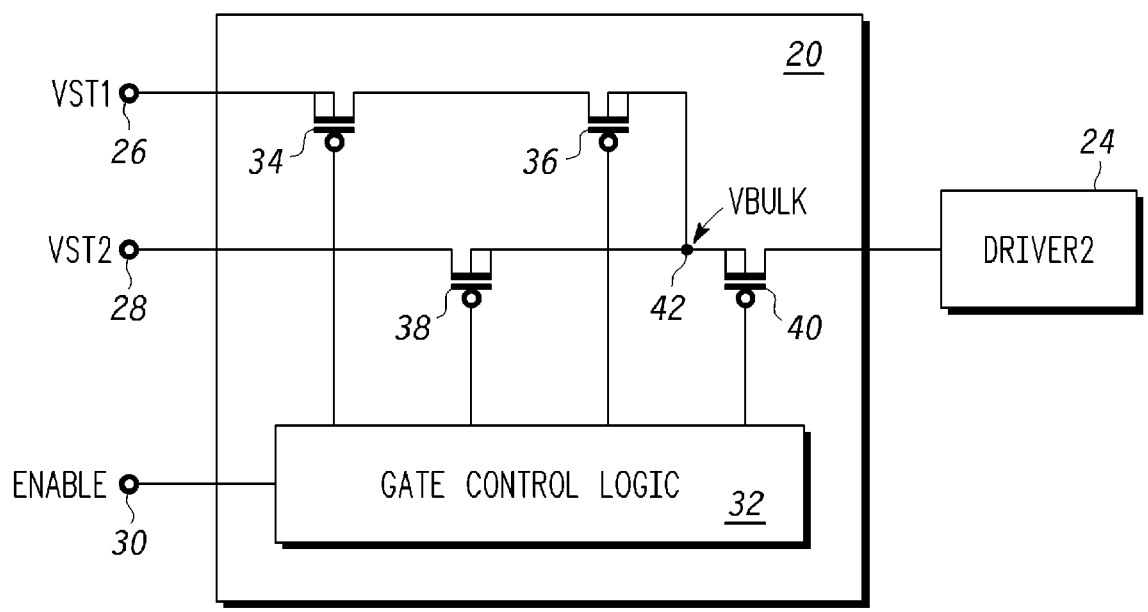
FIG. 3 shows an exemplary circuit diagram of a power switch, consistent with one embodiment of the invention.

FIG. 3 shows an exemplary circuit diagram of a power switch 20, consistent with one embodiment of the invention. Power switch 20 may include gate control logic 32 (labeled as GATE CONTROL LOGIC), a first transistor 34, a second transistor 36, a third transistor 38, and a fourth transistor 40. A first conducting terminal (source or drain, for example) of first transistor 34 may be coupled to first voltage terminal 26. A control terminal (gate, for example) may be coupled to gate control logic 32. A second conducting terminal of first transistor 34 may be coupled to a first conducting terminal of a second transistor 36. A control terminal of second transistor 36 may be coupled to gate control logic 32. A first conducting terminal of a third transistor 38 may be coupled to second voltage terminal 28. A control terminal of third transistor 38 may be coupled to gate control logic 32. A second conducting terminal of third transistor 38 may be coupled to node 42 (labeled as VBULK). The second conducting terminal of second transistor 36 may also be coupled to node 42. A first conducting terminal of a fourth transistor 40 may be coupled to node 42. A control terminal of fourth transistor 40 may be coupled to gate control logic 32. A second conducting terminal of fourth transistor 40 may provide an output, which may be coupled to second driver 24. Further, the enable signal may be coupled vial enable terminal 30 to gate control logic 32. As shown in FIG. 3, the bulk region of first transistor 34 may be coupled to first voltage terminal 26. Additionally, the bulk regions of each of second transistor 36, third transistor 38, and fourth transistor 40 may be coupled to node 42 (labeled as VBULK).

In operation, when the enable signal is high and the first voltage (for example, 1.8 volts) is coupled to first voltage terminal 26 and the second voltage (for example, 1.2 volts) is coupled to second voltage terminal 28, power switch 20 couples the second voltage to second driver 24. This can be accomplished, for example, by gate control logic 32, which turns off first transistor 34 and second transistor 36 and turns on third transistor 38 and fourth transistor 40. This in turn causes the voltage at node 42 to be equal to the second voltage (for example, 1.2 volts), which is in turn, coupled to second driver 24. When the second voltage is coupled to second driver 24, the first voltage is turned off by an integrated circuit supplying the first and second voltages. Alternatively, when the enable signal is low and the first voltage (for example, 1.8 volts) is coupled to first voltage terminal 26 and the second voltage (for example, 1.2 volts) is coupled to second voltage terminal 28 or is coupled to no voltage, power switch 20 couples the first voltage to second driver 24. This can be accomplished, for example, by gate control logic 32, which turns on first transistor 34, second transistor 36, and fourth transistor 40, and turns off third transistor 38. This in turn causes the voltage at node 42 to be equal to the first voltage (for example, 1.8 volts), which is in turn, coupled to second driver 24. When the first voltage is coupled to second driver 24, the second voltage is turned off by the integrated circuit supplying the first and second voltages. Referring back to FIG. 2, when enable signal is high, second driver 24 is used to drive node 12, however, when enable signal is low, first driver 22 is used to drive node 12.

Further, referring to FIG. 3, when enable signal is low and no voltage is coupled to first voltage terminal 26 and the second voltage (for example, 1.2 volts) is coupled to second voltage terminal 28, power switch 20 de-couples first driver 22 and second driver 24 from node 12. Alternatively, when enable signal is high and no voltage is coupled to second voltage terminal 28 and the first voltage (for example, 1.8 volts) is coupled to first voltage terminal 26, power switch 20 de-couples first driver 22 and second driver 24 from node 12. Although details of gate control logic 32 are not shown, it may be implemented using various logic gates or other components.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. It should be understood that circuitry described herein may be implemented either in silicon or another semiconductor material or alternatively by software code representation of silicon or another semiconductor material.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A voltage control circuit comprising:
a first voltage supply terminal for receiving a first voltage;
a second voltage supply terminal for receiving a second voltage, wherein the second voltage is different from the first voltage;
a control logic circuit having an enable terminal for receiving an enable signal;
a first driver coupled to the first voltage supply terminal and an external node;
a second driver coupled to the second voltage supply terminal and the external node;
a first transistor having a first conducting terminal, a second conducting terminal, and a control terminal, wherein the first conducting terminal of the first transistor is coupled to the first voltage supply terminal, the control terminal of the first transistor is coupled to receive a first control signal from the control logic circuit;
a second transistor having a first conducting terminal, a second conducting terminal, and a control terminal, wherein the first conducting terminal of the second transistor is coupled to the second conducting terminal of the first transistor, and wherein the control terminal of the second transistor is coupled to receive a second control signal from the control logic circuit;

a third transistor having a first conducting terminal, a second conducting terminal, and a control terminal, wherein the first conducting terminal of the third transistor is coupled to the second voltage supply terminal and wherein the control terminal of the third transistor is coupled to receive a third control signal from the control logic circuit; and a fourth transistor having a first conducting terminal, a second conducting terminal, and a control terminal, wherein the first conducting terminal of the fourth transistor is coupled to the second conducting terminal of the third transistor, wherein the control terminal of the fourth transistor is coupled to receive a fourth control signal from the control logic circuit, and wherein the second conducting terminal of the second transistor is further coupled to the first conducting terminal of the fourth transistor, wherein in response to a first value of the enable signal the second voltage is provided to the second driver as a result of the control logic circuit turning off the first transistor and the second transistor and the control logic circuit turning on the third transistor and the fourth transistor and wherein in response to a second value of the enable signal the first voltage is provided to the second driver as a result of the control logic circuit turning on the first transistor, the second transistor, the fourth transistor, and the control logic turning off the third transistor.

2. The voltage control circuit of claim 1, wherein:

the first transistor further comprises bulk region, wherein the first conducting terminal of the first transistor is coupled to the bulk region of the first transistor;

the second transistor further comprises a bulk region, wherein the second conducting terminal of the second transistor is coupled to the bulk region of the second transistor;

the third transistor further comprises a bulk region, wherein the second conducting terminal of the third transistor is coupled to the bulk region of the third transistor; and the fourth transistor further comprises a bulk region, wherein the second conducting terminal of the fourth transistor is coupled to the bulk region of the fourth transistor.

3. The voltage control circuit of claim 1, wherein each of the first transistor, the second transistor, the third transistor, and the fourth transistor is a p-channel type transistor.

4. The voltage control circuit of claim 1, wherein the first transistor, the second transistor, the third transistor, and the fourth transistor are part of a power switch.

5. The voltage control circuit of claim 1 wherein the external node comprises a bonding pad.

6. The voltage control circuit of claim 1, wherein the first voltage is greater than the second voltage.

7. A voltage control circuit comprising:

a first driver coupled to a first voltage supply terminal for receiving a first voltage, wherein the first driver is further coupled to an external node;

a power switch coupled to the first voltage supply terminal, a second voltage supply terminal for receiving a second voltage, wherein the second voltage is different from the first voltage, and an enable terminal for receiving an enable signal, wherein the power switch further comprises:

a first transistor having a first conducting terminal, a second conducting terminal, and a first bulk region, wherein:

the first conducting terminal is coupled to the first voltage supply terminal, and the first conducting terminal is coupled to the first bulk region;

a second transistor having a third conducting terminal, a fourth conducting terminal and a second bulk region, wherein:

the third conducting terminal is coupled to the second conducting terminal of the first transistor;

the fourth conducting terminal is coupled to the second bulk region; and the fourth conducting terminal is coupled to a node;

a third transistor having a fifth conducting terminal, a sixth conducting terminal, and a third bulk region, wherein:

the fifth conducting terminal is coupled to the second voltage supply terminal;

the sixth conducting terminal is coupled to the third bulk region; and the sixth conducting terminal is coupled to the node; and a fourth transistor having a seventh conducting terminal, an eighth conducting terminal, and a fourth bulk region, wherein:

the seventh conducting terminal is coupled to the node; and the seventh conducting terminal is coupled to the fourth bulk region; and a second driver coupled to the enable terminal and the eighth conducting terminal of the fourth transistor of the power switch, wherein the second driver is further coupled to the external node, and wherein when the enable terminal receives a first value corresponding to the enable signal, the power switch couples the second voltage to the second driver via the second voltage supply terminal.

8. The voltage control circuit of claim 7, wherein when the enable terminal receives a second value corresponding to the enable signal, wherein the second value is different form the first value, the power switch couples the first voltage to the second driver via the first voltage supply terminal, wherein the first value corresponds to a low value and the second value corresponds to a high value.

9. The voltage control circuit of claim 7, wherein the external node comprises a bonding pad.

10. The voltage control circuit of claim 7, wherein the first voltage is greater than the second voltage.

11. A voltage control circuit comprising:

a first driver coupled to a first voltage supply terminal for receiving a first voltage, wherein the first driver is further coupled to an external node;

a power switch coupled to the first voltage supply terminal, a second voltage supply terminal for receiving a second voltage, wherein the second voltage is different from the first voltage, and an enable terminal for receiving an enable signal;

a control logic circuit for receiving the enable signal and for generating control signals for controlling at least a subset of the functionality of the power switch; and a second driver coupled to the enable terminal, wherein the second driver is further coupled to the external node, and wherein when the enable terminal receives a first value corresponding to the enable signal, the power switch couples the second voltage to the second driver via the second voltage supply terminal, wherein when the enable terminal receives a second value corresponding to the enable signal, wherein the second value is different form the first value, the power switch couples the first voltage to the second driver via the first voltage supply terminal, wherein the power switch further comprises:

a first transistor having a first conducting terminal, a second conducting terminal, and a first bulk region, wherein:

the first conducting terminal is coupled to the first voltage supply terminal, and the first conducting terminal is coupled to the first bulk region;

a second transistor having a third conducting terminal, a fourth conducting terminal and a second bulk region, wherein:

the third conducting terminal is coupled to the second conducting terminal of the first transistor;

the fourth conducting terminal is coupled to the second bulk region; and the fourth conducting terminal is coupled to a node;

a third transistor having a fifth conducting terminal, a sixth conducting terminal, and a third bulk region, wherein:

the fifth conducting terminal is coupled to the second voltage supply terminal;

the sixth conducting terminal is coupled to the third bulk region; and the sixth conducting terminal is coupled to the node; and a fourth transistor having a seventh conducting terminal, an eighth conducting terminal, and a fourth bulk region, wherein:

the seventh conducting terminal is coupled to the node; and the seventh conducting terminal is coupled to the fourth bulk region.

12. The voltage control circuit of claim 11, wherein the first transistor further comprises a control terminal, the second transistor further comprises a control terminal, the third transistor further comprises a control terminal, and the fourth transistor further comprises a control terminal and wherein a first one of the control signals is coupled to the control terminal of the first transistor, a second one of the control signals is coupled to the control terminal of the second transistor, a third one of the control signals is coupled to the control terminal of the third transistor, and a fourth one of the control signals is coupled to the control terminal of the fourth transistor.

13. The voltage control circuit of claim 11, wherein the external node comprises a bonding pad.

14. The voltage control circuit of claim 11, wherein the first voltage is greater than the second voltage.

* * * * *

UNITED STATES PATENT AND TRADEMARK OFFICE
CERTIFICATE OF CORRECTION

| | |
|---|---|
| PATENT NO. | : 7,432,754 B2 |
| APPLICATION NO. | : 11/460349 |
| DATED | : October 7, 2008 |
| INVENTOR(S) | : Kiyoshi Kase and Dzung T. Tran |

It is certified that error appears in the above-identified patent and that said Letters Patent is hereby corrected as shown below:

Col. 6, in claim 8, line 39, replace "form" with --from--;
Col. 7, in claim 11, line 1, replace "form" with --from--.

Signed and Sealed this

Thirtieth Day of December, 2008

JON W. DUDAS
*Director of the United States Patent and Trademark Office*